United States Patent [19]
Lehmann et al.

[11] Patent Number: 5,494,832
[45] Date of Patent: Feb. 27, 1996

[54] METHOD FOR MANUFACTURING A SOLAR CELL FROM A SUBSTRATE WAFER

[75] Inventors: Volker Lehmann, Munich; Josef Willer, Riemerling; Wolfgang Hoenlein, Unterhaching, all of Germany

[73] Assignee: Siemens Aktiengesellschaft, Munich, Germany

[21] Appl. No.: 219,535

[22] Filed: Mar. 29, 1994

[30] Foreign Application Priority Data

Mar. 29, 1993 [DE] Germany ............................ 4310206

[51] Int. Cl.$^6$ ............................................ H01L 31/18
[52] U.S. Cl. ............................ 437/2; 437/3; 437/228
[58] Field of Search ........................... 437/2, 3, 22 B, 437/974, 981, 944; 146/DIG. 145; 136/255

[56] References Cited

U.S. PATENT DOCUMENTS

| | | | |
|---|---|---|---|
| 3,969,746 | 7/1976 | Kendall et al. | 136/255 |
| 4,409,423 | 10/1983 | Holt | 136/255 |
| 5,306,647 | 4/1994 | Lehmann et al. | 437/2 |

FOREIGN PATENT DOCUMENTS

| | | |
|---|---|---|
| 0296348 | 12/1988 | European Pat. Off. . |
| 3015355 | 11/1980 | Germany . |
| 4202455 | 8/1993 | Germany . |

OTHER PUBLICATIONS

Rudolf Muller, Springer–Verlag, Berlin–Heidelberg–New York, 1979, Bauelemente der Halbleiter–Elektronik, pp. 45–47.

K. Fukui et al., "Through Hole Back Contact Solar Cell", Fourth Sunshine Workshop on Crystalline Solar Cells, Technical Digest pp. 25–29 (date unknown).

*Primary Examiner*—George Fourson
*Assistant Examiner*—S. Mulpuri
*Attorney, Agent, or Firm*—Hill, Steadman & Simpson

[57] ABSTRACT

Through-holes are formed in a substrate wafer by electrochemical etching, so that a perforated, self-supporting layer of n-doped, monocrystalline silicon arises. An n-doped region and a p-doped region that form a pn-junction and that both adjoin a first principal face of the self-supporting layer are produced in the self-supporting layer. A contact to the n-doped region and a contact to the p-doped region are formed on the first principal face, so that the pn-junction can be interconnected as solar cell into which the light incidence can occur via a second principal face lying opposite the first.

17 Claims, 3 Drawing Sheets

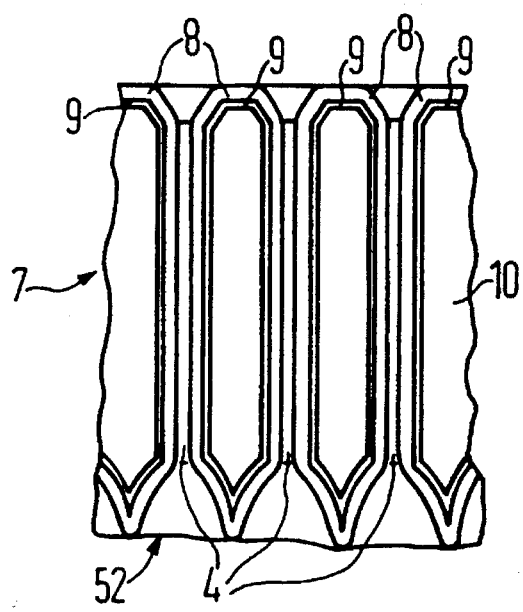
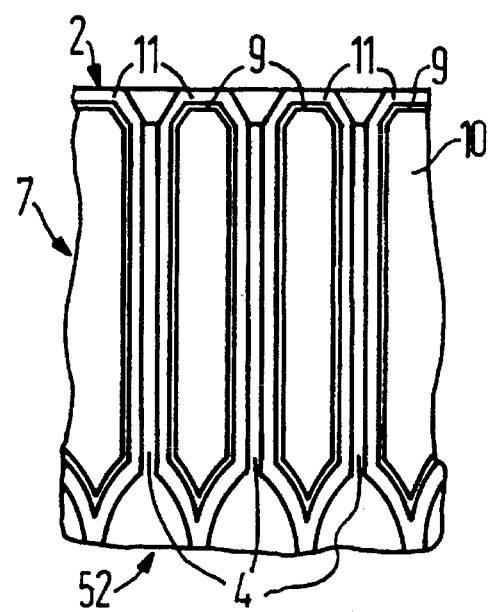
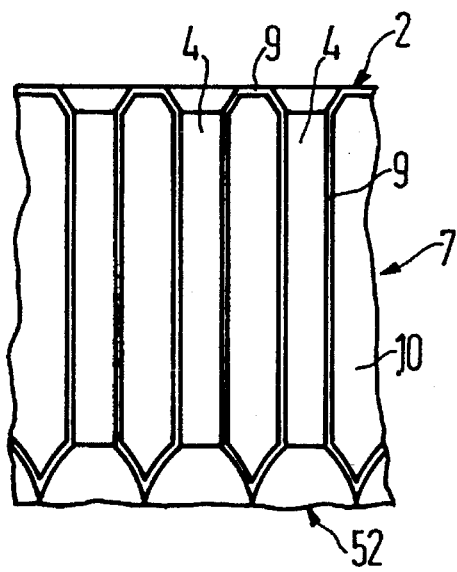
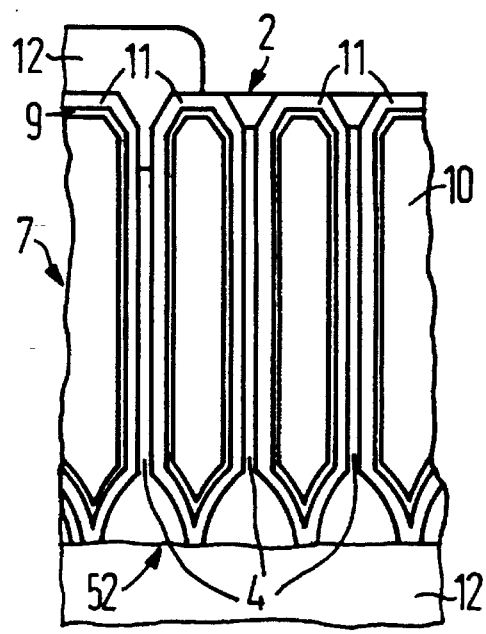

1

METHOD FOR MANUFACTURING A SOLAR CELL FROM A SUBSTRATE WAFER

BACKGROUND OF THE INVENTION

1. Field of the Invention

The present invention is directed generally to solar cells and more specifically to a method for manufacturing a solar cell from a substrate wafer.

2. Description of the Related Art

Among other things, substrate wafers of monocrystalline silicon are used for manufacturing solar cells. The monocrystalline solar cells manufactured therefrom are superior with respect to efficiency and long-term stability to others manufactured using polycrystalline or amorphus silicon.

An electrical contact is usually situated on each side in monocrystalline solar cells. The light is thereby incident through a surface at which a contact is arranged (see, for example, R. Mueller, Bauelemente der Halbleiterelektronik, Springer Verlag 1979, pages 45–47).

Since a contact is arranged on the surface of the solar cell facing toward the light, a part of this surface is occluded. This results in a lower overall efficiency of the solar cell.

In order to keep this occlusion slight, the contact on the surface facing toward the light is structured, for example, in a comb-like manner. The line cross section of the contact is thereby kept at a minimum. Increased ohmic losses, however, are connected therewith, these in turn lead to a deterioration of the efficiency.

Since the electrical contacts are arranged at opposite sides, a plurality of solar cells of this type can only be interconnected by using a conductive connecting element, for example, a wire. To that end, a certain spacing between neighboring solar cells must be observed so that the connecting element can be conducted onto the backside of the neighboring cell. The available area to be occupied with solar cells cannot be as dense as desired.

T. Fukui et al, Techn. Dig. of Fourth Sunshine Workshop on Crystalline Solar Cells (1992), Chiba, Japan, pp. 25–29 disclose a solar cell that has through-holes from the front side to the back side of the solar cell having a spacing of 150 µm. The solar cell is manufactured of p-doped silicon. The solar cell has an n-doped region at the front side of the solar cell and along the surface of the holes. Proceeding from the back side, the n-doped region is connected by n-contacts and the p-doped region is connected by p-contacts. Such through-holes through silicon substrates can be produced, in particular, by using a laser. Each hole must thereby be separately generated.

SUMMARY OF THE INVENTION

It is an object of the present invention to provide a method for manufacturing a solar cell from a substrate wafer with which a contacting of the solar cell is provided from the back side. Another object is that the present invention is advantageously used in large-scale industrial utilization.

The objects of the present invention are inventively achieved in a method for manufacturing a solar cell from a substrate wafer, having the steps of forming through-holes in a substrate wafer of n-doped, monocrystalline silicon by electrochemical etching a first surface, to produce a perforated, self supporting layer of n-doped, monocrystalline silicon, producing at least one n-doped region and one p-doped region to form a pn-junction in the self-supporting layer, both of the regions adjoining a first principal face of the self-supporting layer, whereby the first principal face is oriented parallel to the first surface, and forming a contact to the n-doped region and a contact to the p-doped region on the first principal face, for operating the pn-junction as a solar cell into which light is incident via a second principal face lying opposite the first.

The use of a perforated, self-supporting layer of n-doped, monocrystalline silicon makes it possible in the method of the invention to contact the n-doped region and the p-doped region proceeding from the same side via the first principal face. To that end, the entire surface of the self-supporting layer is provided, in particular, with a p-doping. The n-doped region is thereby formed by the inside of the self-supporting layer which is also n-doped. The p-doped surface is then selectively etched off, for example, by using a mask, in a region of the first principal face wherein the contact to the n-doped region should result, being etched off until the n-doped region is uncovered in this region, which is then being provided with a contact.

The electrochemical etching of n-doped silicon for producing holes or trenches is disclosed, for example, by EP 0 296 348 A1 wherein trenches are produced, particularly for DRAM cells. It has been proposed in German patent application P 42 02 455.2 to use this etching method for stripping self-supporting layers off, which are used as initial material for the manufacture of solar cells. The solar cells, like conventional monocrystalline solar cells, are thereby contacted by contacts at opposite sides. Thus, one contact is oriented on the surface through which the light is incident.

The substrate wafer is connected as a anode in the electrochemical etching. As a result thereof, the minority charge carriers move in the n-doped silicon to the surface in contact with the electrolyte. A space charge zone forms at this surface. Since the field strength is greater in the region of depressions in the surface than outside of these regions, the minority charge carriers preferably move to these points. A structuring of the surface results. All the more minority charge carriers move to a point because of the increased field strength. The etching attack at this point is more pronounced the deeper an initially small irregularity becomes due to the etching. The holes grow in the crystallographic <100> direction. It is therefore advantageous to use a substrate having <100> orientation since the holes then grow perpendicularly relative to the first surface. This results in a uniform structuring of the substrate wafer.

The etching attack is dependent on the current density in the substrate wafer and on the concentration in the electrolyte. The etching attack is increased by elevating the current density in the substrate wafer or by diminishing the concentration in the electrolyte. It lies within the framework of the invention to exploit this fact to increase the etching erosion such that when a depth of the holes essentially corresponds to the thickness of the self-supporting layer, the cross section of the holes grows. Since, as stated above, the etching attack occurs only in the lower region of the holes, the cross section of the holes thereby remains unmodified in the upper region, i.e., in the proximity of the first surface. In the lower region, however, the holes grow both in width as well as in depth. The electrochemical etching is continued until neighboring holes grow together, and the self-supporting layer is thereby stripped off.

Like the silicon wafer, the self-supporting layer is composed of n-doped, monocrystalline silicon. The thickness of the self-supporting layer can be set via the depth of the holes. The self-supporting layer, having a thickness of at least 10

µm, can be set to any desired value. In particular, the self-supporting layer can be manufactured with a thickness of approximately 60 µm. This corresponds to the theoretical value for the ideal thickness with respect to efficiency.

After the self-supporting layer has been stripped off, at least one further self-supporting layer can be stripped off from the remaining substrate wafer in the same way by using electrochemical etching. The method for stripping further self-supporting layers off can be repeated until the mechanical stability of the remaining substrate wafer is no longer adequate.

Since the surface of the self-supporting layer is rough due to the etching process, an optical reflection minimization results without additional process steps. The current density in the substrate wafer can be influenced in an especially simple way in the electrochemical etching by illuminating a second surface of the substrate wafer lying opposite the first surface. In this case, the stripping-off of the self-supporting layer is achieved by intensifying the illumination.

An embodiment of the present invention provides the first surface of the substrate wafer with a surface topology before the formation of the holes. In this way, the first surface is intentionally provided with depressions at which the etching attack begins in the electrochemical etching. When the first surface is provided with a surface topology of regularly arranged depressions, the stripped, self-supporting layer exhibits an essentially constant thickness. In this case, namely, the spacing of the holes is essentially identical, so that the quantity of material between neighboring holes that must be etched off by intensifying the etching attack in order to strip the self-supporting layer off remains essentially the same. The holes then essentially grow together simultaneously.

For applications wherein a constant thickness of the self-supporting layer is not a concern, producing the surface topology can be omitted. This leads to a simplification of the process.

The surface topology is thereby generated, for example, after the production of a photoresist mask on the first surface and subsequent alkaline etching of the first surface. Conventional optical photolithography is thereby employed for producing the photoresist mask.

Another embodiment of the present invention produces the surface topology by light-induced, electrochemical etching in the same electrolyte wherein the holes are subsequently etched. An illumination pattern is thereby produced on the first surface by using a light source having a wavelength of less than 1100 nm. The current density in the substrate wafer is set such that an anodic minority carrier current locally flows across the substrate wafer only at exposed locations of the illumination pattern, which effects an etching erosion of the first surface. This procedure has the advantage that no separate etching technique must be applied for producing the surface topology.

The invention shall be set forth in greater detail below with reference to the figures and an exemplary embodiment.

BRIEF DESCRIPTION OF THE DRAWINGS

FIG. 5 through FIG. 11 show the method for manufacturing the solar cell.

DETAILED DESCRIPTION OF THE PREFERRED EMBODIMENTS

Figure 1:
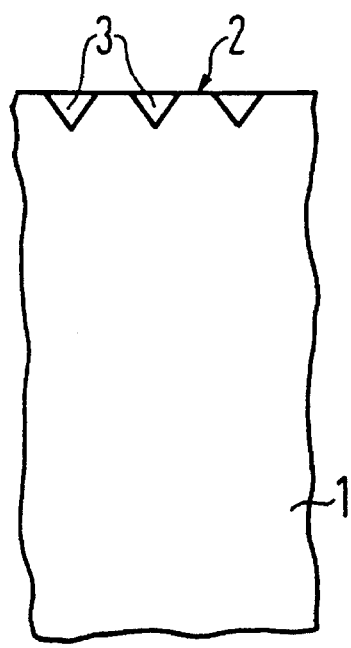
FIG. 1 shows a substrate wafer having a surface topology.
Figure 2:
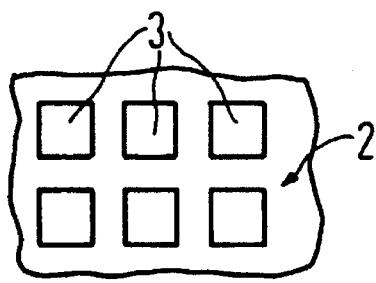
FIG. 2 shows a plan view onto the substrate wafer shown in FIG. 1.

In a substrate wafer 1 of n-doped, monocrystalline silicon having, for example, <100> orientation is provided with a surface topology comprising depressions 3 in a first surface 2 (see FIG. 1). The depressions 3 are regularly arranged in the first surface 2 (see the plan view onto FIG. 1 in FIG. 2).

For example, the depressions 3 are produced by using conventional photolithography and subsequent alkaline etching after the production of a photoresist mask. Alternatively, the surface topology can be formed by light-induced, electrochemical etching. After the production of the depressions 3, the first surface 2 is brought into contact with an electrolyte. The electrolyte contains fluoride and is acidic. It contains a hydrofluoric acid concentration of 1–50% preferably 6% by weight. An oxidation agent, for example hydrogen peroxide, can be added to the electrolyte to suppress the development of hydrogen bubbles on the first surface 2 of the substrate wafer 1. A voltage of, for example, 3 volts is applied between the substrate wafer 1 and the electrolyte. The substrate wafer 1 that, for example, has resistivity of 5 ohms cm is thereby connected as anode. The substrate wafer 1 is illuminated from a second surface lying opposite the first surface. Due to the illumination, a current density of 10 $mA/cm^2$ is set in the substrate wafer 1.

Figure 3:
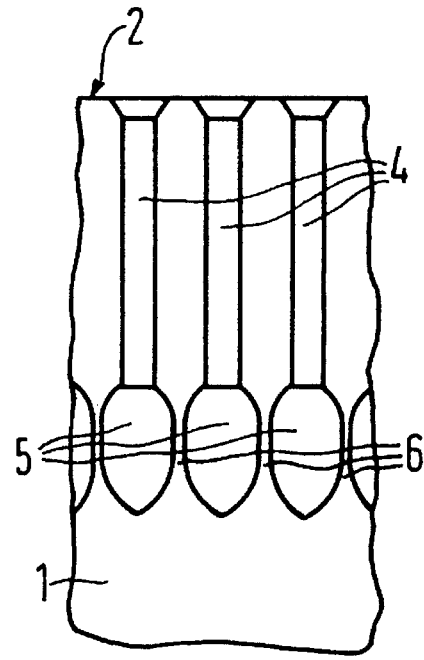
FIG. 3 and FIG. 4 show the stripping of a self-supporting layer off from the substrate wafer.

Holes 4 are etched into the first surface 2 with these process parameters (see FIG. 3). The holes 4 are perpendicular to the first surface 2. They comprise a constant cross-section parallel to the first surface 2 over their depth. The cross-section of the holes 4 is dependent on the current density in the substrate wafer 1 and on the fluoride concentration of the electrolyte.

Figure 4:
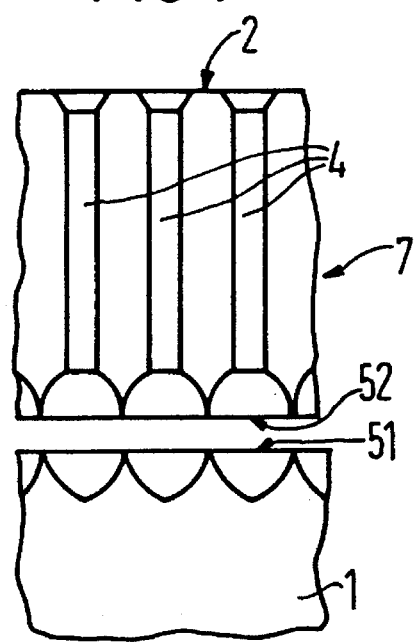

After an etching time of 60 minutes, a depth of the holes 4 of approximately 30 µm is achieved with the aforementioned process parameters. At this depth, the current density in the substrate wafer 1 is increased to, for example, 30 $mA/cm^2$. The voltage between the substrate wafer 1 and the electrolyte is thereby set at 2 volts. The substrate wafer 1 continues to be illuminated from the second surface. Due to these varied process parameters, cave-shaped expansions 5 arise at the floor of the holes 4 because the current density has been increased. Neighboring cave-shaped expansions 5 are separated by webs 6. The width of the webs 6 decreases during the etching. After about 10 minutes, the webs 6 have been etched off with the recited process parameters. The cave-shaped expansions 5 and, thus, the holes 4 grow together (see FIG. 4).

As a result thereof, the self-supporting layer 7 is stripped off from the rest of the substrate wafer 1. The self-supporting layer 7 comprises the first surface 2 and the holes 4. Since the cave-shaped expansions 5 of the holes 4 have grown together, that side of the self-supporting layer facing away from the first surface 2 has a first surface structured surface 52.

The rest of the substrate wafer 1 likewise has a substrate structured surface 51 as a consequence of the cave-shaped expansions 5 having grown together. As a result of its creation, the substrate structured surface 51 is therefore provided with a surface topology. This surface topology corresponds to the arrangement of the depressions 3 at the beginning of the processing of the substrate wafer 1 (see FIG. 1). A further self-supporting layer can be stripped off by electrochemical etching proceeding from a substrate wafer 1 having the substrate structured surface 51. This is possible as long as the mechanical stability of the rest of the substrate wafer 1 allows. The limit is a thickness of the rest of the substrate wafer 1 of 100–200 µm.

A solar cell is manufactured from the self-supporting layer 7. It is important for the manufacture of the solar cell that the self-supporting layer 7 comprises through-holes 4. It is therefore also possible to use a self-supporting layer that is composed of a substrate wafer in which through-holes have been produced as the initial material for manufacturing the solar cell. It is not required that the self-supporting layer 7 be manufactured by stripping. However, it is advantageous to produce the self-supporting layer 7 by stripping in the way set forth, since the thickness of the solar cell can thereby be set to the optimum, theoretical value.

For manufacturing the solar cell, a layer 8 of borophosphorous silicate glass (BPSG) is applied onto the entire surface of the self-supporting layer. The layer 8 also covers the surfaces of the holes 4 (see FIG. 5). A p$^+$-doped region 9 that is arranged over the entire surface of the self-supporting layer 7 is formed by drive-out of boron from the layer 8 of BPSG. The doping in the p$^+$-doped region 9 is set, for example, to $10^{19}$ per cm$^3$. An n-doped region 10 remains in the inside of the self-supporting layer 7. The same resistivity as in the substrate wafer, for example 5 ohms cm, is present in the n-doped region 10.

Subsequently, the layer 8 of BPSG is removed (see FIG. 6). The surface of the self-supporting layer 7 is subsequently oxidized, for example thermally oxidized, so that a SiO$_2$ layer 11 results that covers the entire surface of the self-supporting layer and the holes 4 as well (see FIG. 7).

Subsequently, a positive photoresist layer 12 is applied, which covers both the first surface 2 as well as the first surface structured surface 52. The positive photoresist layer 12 is exposed and developed, whereby a part of the first surface 2 is uncovered by the removal of photoresist during the development (see FIG. 8). A contact to the n-doped region 10 is subsequently produced in that part of the first surface 2 not covered by the photoresist layer.

Figure 9:
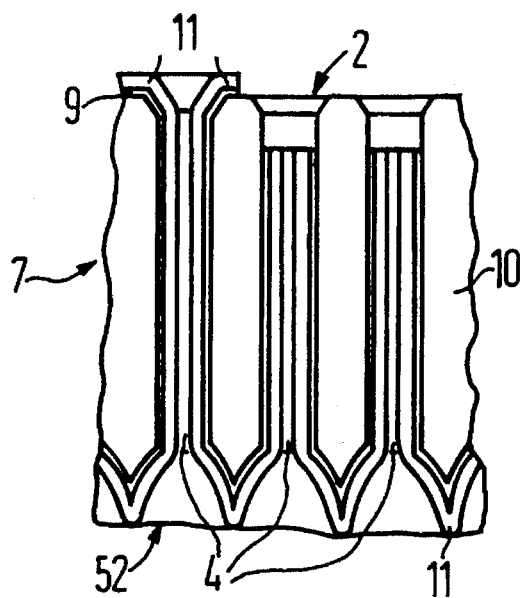

The uncovered part of the SiO$_2$ layer 11 is etched off by using the photoresist layer 12 as mask. After removal of the photoresist layer 12 (see FIG. 9), the uncovered part of the p-doped region 9 is removed by using the structured SiO$_2$ layer 11 as a mask. The surface of the n-doped region 10 is thereby uncovered in that part of the first surface 2 in which a contact to the n-doped region 10 is to be produced.

Figure 11:
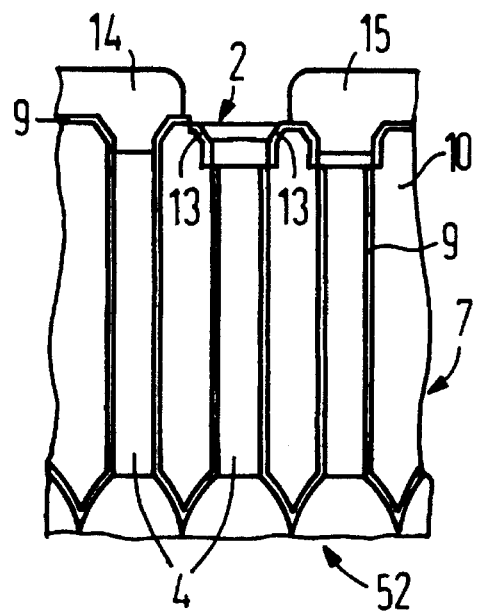
Figure 10:
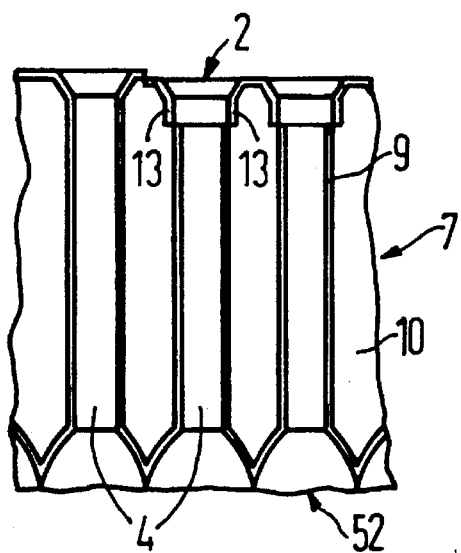

Upon employment of the structure SiO$_2$ layer 11 as a mask, an n$^+$-doped region 13 is produced at the surface of the uncovered n-doped region 10, for example by implantation with arsenic. A dopant concentration of, for example, $10^{20}$ cm$^{-3}$ is set in the n$^+$-doped region 13. After removing the structured SiO$_2$ layer 11 (see FIG. 10), a first contact 14 and a second contact 15 are produced on the first surface 2, for example by being printed with conductive silver paste. The first contact 14 is thereby arranged in that part of the first surface 2 wherein the p-doped region 9 adjoins the surface. The second contact 15 is arranged in that part of the first surface 2 wherein the n$^+$-doped region adjoins the first surface 2 due to the etch-off of the p-doped region 9 and due to implantation. The p-doped region 9 is thus contacted by the first contact 14, whereas the n-doped region 10 is contacted via the second contact 15 (see FIG. 11).

The first principal face coincides with the first surface 2 in this solar cell. The second principal face, through which the light is incident into the solar cell, coincides with the first surface structured surface 52. The manufacturing method of the invention can be analogously implemented when the first surface structured surface 52 is used as first principal face and the first surface 2 is used as second principal face.

An occlusion of the solar cells is avoided by arranging both contacts on what is the backside of the solar cell during operation of the solar cell. The contacts can thus be implemented such that the ohmic losses are minimized. Further, an interconnection of solar cells proceeding from the back side can occur.

The elasticity of the self-supporting layer, moreover, allows a surface-filling laying of the solar cells on a non-planar carrier provided with interconnects.

Although other modifications and changes may be suggested by those skilled in the art, it is the intention of the inventors to embody within the patent warranted hereon all changes and modifications as reasonably and properly come within the scope of their contribution to the art.

We claim:

1. A method for manufacturing a solar cell from a substrate wafer, comprising the steps of:

forming through-holes in a substrate wafer of n-doped, monocrystalline silicon by electrochemical etching a first surface of said substrate wafer to produce a perforated, self-supporting layer of n-doped, monocrystalline silicon;

producing at least one n-doped region and at least one p-doped region to form a pn-junction in said self-supporting layer, both of said regions adjoining a first principal face of said self-supporting layer, said first principal face being oriented parallel to said first surface, said step of producing said at least one p-doped layer including p$^+$-doping an entire surface of said first surface of said self-supporting layer to produce a p$^+$-doped region so that said pn-junction is formed, whereas said n-doped region comprises an inside of said self-supporting layer;

producing a mask that covers an entire surface of said first surface of said self-supporting layer except a portion of said first surface in which said n-doped region is to adjoin said first principal face;

uncovering said first surface of said n-doped region by etching off said p$^+$-doped surface not covered by said mask;

forming a contact to said at least one n-doped region and a contact to said at least one p-doped region on said first principal face for operating said pn-junction as a solar cell into which light is incident via a second principal face lying opposite to said first principal face, including providing a respective contact for a p$^+$-doped region and said uncovered n-doped region at said first principal face after removal of said mask.

2. A method according to claim 1, wherein said step of forming through-holes includes:

forming holes in said substrate wafer by electrochemical etching beginning at said first surface; and modifying process parameters of said electrochemical etching when a depth of said holes is approximately a thickness of said self-supporting layer to cause a cross section of said holes to grow such that said self-supporting layer is separated from said substrate wafer as a result of said holes growing together.

3. A method according to claim 2, wherein said step of modifying process parameters includes: increasing current density in said substrate wafer.

4. A method according to claim 2, wherein said electrochemical etching utilizes a fluoride-containing acidic electrolyte, and said step of modifying process parameters includes: reducing a concentration of fluoride in said fluoride-containing acidic electrolyte.

5. A method according to claim 1, wherein said step of forming through-holes is further defined by:

implementing said electrochemical etching in a fluoride-containing, acidic electrolyte with which said first surface is in contact and applying an electrical voltage between said first surface and said substrate wafer wherein said substrate wafer is connected as an anode; and setting a current density that influences etching erosion in said substrate wafer.

6. A method according to claim 5, wherein said electrolyte used in said electrochemical etching includes a concentration of 1–50% hydrofluoric acid by weight.

7. A method according to claim 6, wherein said electrolyte used in said electrochemical etching includes an oxidation agent.

8. A method according to claim 1, wherein said step of forming through-holes is further defined by forming said through-holes perpendicular to said first surface.

9. A method according to claim 1, wherein said method is further defined by providing a <100> wafer as said substrate wafer.

10. A method according to claim 1, wherein said electrochemical etching includes setting of a current density in said substrate wafer by illuminating said substrate wafer through a second surface lying opposite said first surface.

11. A method according to claim 1, further comprising a step of:

producing a surface topology which defines an arrangement of said holes at said first surface of said substrate wafer before said step of forming said through-holes.

12. A method according to claim 11, wherein said producing step is further defined by producing said surface topology with regularly-arranged depressions on said first surface.

13. A method according to claim 11, wherein said producing step is further defined by:

producing said surface topology using a photoresist mask on said first surface of said substrate wafer, and performing a subsequent alkaline etching of said first surface of said substrate wafer.

14. A method according to claim 11, wherein said producing step is further defined by producing said surface topology by electrochemical etching in an electrolyte wherein an illumination pattern is produced on said first surface by using a light source having a wavelength less than 1100 nm and setting said current density in said substrate wafer such that an anodic minority carrier current flows locally over said substrate wafer only at exposed locations of said illumination pattern, said minority carrier current effecting an etching erosion of said first surface.

15. A method according to claim 1, wherein said method is further defined by:

providing said uncovered parts of said n-doped region with an $n^+$-doping before removing said mask.

16. A method according to claim 1, wherein said method is further defined by:

coating said self-supporting layer with a layer of borophosphorous silicate glass that covers said entire surface of said self-supporting layer; and $p^+$-doping said surface of said self-supporting layer by drive-out of boron from said layer of borophosphorous silicate glass.

17. A method according to claim 1, wherein said method is further defined by:

providing said entire surface of said self-supporting layer with a $SiO_2$ layer for producing said mask;

providing said $SiO_2$ layer with a positive photoresist on said first principal face and on said second principal face;

exposing said positive photoresist such that said positive photoresist is removed in that part of said first principal face wherein said n-doped region is to adjoin said first principal face during developing;

removing said uncovered part of said $SiO_2$ layer by using said developed positive photoresist as an etching mask, thereby uncovering said $p^+$-doped surface of said self-supporting layer in this region.

* * * * *